(12) United States Patent
Jiang

(10) Patent No.: US 7,135,780 B2
(45) Date of Patent: Nov. 14, 2006

(54) SEMICONDUCTOR SUBSTRATE FOR BUILD-UP PACKAGES

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 282 days.

(21) Appl. No.: 10/365,998

(22) Filed: Feb. 12, 2003

(65) Prior Publication Data

US 2004/0157361 A1 Aug. 12, 2004

(51) Int. Cl.
*H01L 23/48* (2006.01)

(52) U.S. Cl. .................. 257/783; 257/782; 438/107; 438/118

(58) Field of Classification Search ............. 438/106, 438/107, 118; 257/782, 783
See application file for complete search history.

(56) References Cited

U.S. PATENT DOCUMENTS

| | | |
|---|---|---|
| 3,903,590 A | 9/1975 | Yokogawa |
| 4,866,501 A | 9/1989 | Shanefield |
| 5,073,814 A | 12/1991 | Cole, Jr. et al. |
| 5,280,192 A | 1/1994 | Kryzaniwsky |
| 5,315,486 A | 5/1994 | Fillion et al. |
| 5,324,687 A | 6/1994 | Wojnarowski |
| 5,331,203 A | 7/1994 | Kitada et al. |
| 5,432,677 A | 7/1995 | Mowatt et al. |
| 5,434,751 A | 7/1995 | Cole, Jr. et al. |
| 5,527,741 A | 6/1996 | Cole et al. |
| 5,546,654 A | 8/1996 | Wojnarowski et al. |
| 5,565,706 A | 10/1996 | Miura et al. |
| 5,745,984 A | 5/1998 | Cole, Jr. et al. |
| 5,757,072 A | 5/1998 | Gorowitz et al. |
| 5,808,874 A | 9/1998 | Smith |
| 5,837,427 A | 11/1998 | Hwang et al. ............ 430/312 |
| 5,841,193 A | 11/1998 | Eichelberger |
| 5,866,952 A * | 2/1999 | Wojnarowski et al. ...... 257/788 |
| 5,936,305 A | 8/1999 | Akram |
| 5,975,408 A | 11/1999 | Goossen |
| 6,000,127 A | 12/1999 | Eifuku et al. |
| 6,057,593 A | 5/2000 | Iovdalsky et al. |
| 6,159,767 A | 12/2000 | Eichelberger ............ 438/107 |
| 6,175,161 B1 | 1/2001 | Goetz et al. |
| 6,181,569 B1 | 1/2001 | Chakravorty |
| 6,202,298 B1 | 3/2001 | Smith |
| 6,214,642 B1 | 4/2001 | Chen et al. |
| 6,228,687 B1 | 5/2001 | Akram et al. |
| 6,236,109 B1 | 5/2001 | Hsuan et al. |
| 6,239,367 B1 | 5/2001 | Hsuan et al. |
| 6,274,391 B1 | 8/2001 | Wachtler et al. |
| 6,350,668 B1 | 2/2002 | Chakravorty |
| 6,365,438 B1 | 4/2002 | Ishida et al. |
| 6,368,896 B1 | 4/2002 | Farnworth et al. |
| 6,389,691 B1 | 5/2002 | Rinne et al. |

(Continued)

*Primary Examiner*—Chuong Anh Luu
(74) *Attorney, Agent, or Firm*—Schwegman, Lundberg, Woessner & Kluth, P.A.

(57) ABSTRACT

The present invention provides techniques to fabricate build-up single or multichip modules. In one embodiment, this is accomplished by dispensing die-attach material in one or more pre-etched cavities on a substrate. A semiconductor die is then placed over each pre-etched cavity including the die-attach material by urging a slight downward pressure on the substrate such that an active surface of each placed semiconductor die is disposed across from the substrate and is further substantially coplanar with the substrate. The semiconductor die is then secured to the substrate by curing the die-attach material. A miniature circuit board, including one or more alternating layer of dielectric material and metallization structures, is then formed over the substrate and the active surface of each semiconductor die to electrically interconnect the semiconductor dies.

52 Claims, 7 Drawing Sheets

U.S. PATENT DOCUMENTS

| | | |
|---|---|---|
| 6,423,570 B1 | 7/2002 | Ma et al. |
| 6,437,240 B1 | 8/2002 | Smith |
| 6,506,664 B1 | 1/2003 | Beyne et al. |
| 6,518,163 B1 | 2/2003 | Sakuyama et al. |
| 6,521,530 B1 | 2/2003 | Peters et al. |
| 6,555,906 B1 | 4/2003 | Towle et al. |
| 6,617,687 B1 | 9/2003 | Akram et al. |
| 6,709,897 B1 | 3/2004 | Cheng et al. |
| 6,709,898 B1 | 3/2004 | Ma et al. |
| 6,734,534 B1 | 5/2004 | Vu et al. |
| 6,756,662 B1 | 6/2004 | Infantolino et al. |
| 6,867,499 B1 | 3/2005 | Tabrizi |
| 6,964,881 B1 | 11/2005 | Chua et al. |
| 2002/0004257 A1 * | 1/2002 | Takaoka et al. ............ 438/107 |
| 2004/0042190 A1 * | 3/2004 | Eng et al. .................. 361/795 |
| 2004/0043533 A1 * | 3/2004 | Chua et al. ................ 438/106 |
| 2005/0085014 A1 | 4/2005 | Jiang |

\* cited by examiner

US 7,135,780 B2

SEMICONDUCTOR SUBSTRATE FOR BUILD-UP PACKAGES

FIELD OF THE INVENTION

The present invention relates to semiconductor devices and, in particular, to single and multichip packages.

BACKGROUND OF THE INVENTION

The conventional approach to electronic packaging and interconnection has been to package individual integrated circuit (IC) chips in a single package and to attach these packages to a printed circuit board to provide interconnection between the individual IC chips. In recent years, this approach has met with problems of speed, size, and interconnection density due to ever constant demands for reduced size and increased performance from such integrated circuit packages.

One solution to many of the above problems is the multichip module (MCM). In an MCM, bare (unpackaged) IC chips are interconnected by means of a miniature printed circuit board whose interconnection pitch may match the pitch of the IC chip. There are presently two main classes of MCM. These are the "chips last MCM" and the "chips first MCM". In the chips last MCM, the miniature circuit board is fabricated first and then the bare IC chips are attached and interconnected to the circuit board. The method of interconnection is usually wire bond or solder bump. In the chips first MCM, the chips are placed and bonded to a substrate, and a miniature circuit board is then built above the chips. The method of interconnection, usually entails forming IC chips as an integral part of the processing of the circuit board. Currently, the industry uses build-up technology to interconnect IC chips in the chips first MCM. Build-up technology to interconnect IC chips in the chips first MCM is generally known. One such technique that is relevant to the present subject matter is discussed in U.S. Pat. No. 6,159,767.

As mentioned above, the chips first MCM requires placing the IC chips first relative to each other on a substrate. It is generally difficult to maintain consistency during placement and bonding of the IC chips onto a substrate. The inconsistencies in placing and bonding IC chips onto a substrate generally result in coplanarity and alignment problems between the IC chips and the substrate.

Generally, a thicker dielectric layer is required in forming the miniature circuit board over the IC chips to overcome the above-described inconsistency problems. The thicker the dielectric layer, the higher the thermal buildup and the mechanical stress generated during post-processing operations of the multichip module. In addition, the thickness of the dielectric layer formed over the IC chips can vary substantially due to coplanarity problems between the upper surfaces of the IC chips and the dielectric layer. In addition, the cost of raw material used in forming the dielectric layer increases due to its increased thickness. Further, variations in the thickness of the dielectric layer can cause changes in the dielectric properties, such as capacitance. Furthermore, variations in the thickness of the dielectric layer can cause post-processing problems, such as metal deposition rate, varying etch rate, metal coverage, and so on, which can ultimately result in a lower yield.

Thus, there is a need in the art for a technique to form MCMs using build-up technology that can overcome the above-described problems.

SUMMARY OF THE INVENTION

The present invention provides techniques for fabricating a multichip module using build-up technology.

In one aspect, the invention provides methods for forming a multichip module using build-up technology to interconnect semiconductor dies. In one embodiment of the methods, the multichip module is fabricated by dispensing die-attach material in one or more pre-etched cavities disposed on a substrate. A semiconductor die is then placed over each pre-etched cavity, including the die-attach material, by urging a slight downward pressure to place the semiconductor die to be substantially coplanar with the substrate. The semiconductor die is then secured to the substrate by curing the die-attach material. A miniature circuit board is then formed over the substrate and the secured semiconductor dies by forming a multilayer structure including alternating layers of dielectric and conductive materials that is substantially coplanar with the substrate to electrically interconnect the semiconductor dies.

In another aspect, the invention provides methods for forming a build-up multichip module on a silicon substrate. In one embodiment of the methods, the multichip module is formed by dispensing die-attach material in each of one or more first pre-etched cavities disposed on a substrate. An IC chip is then placed in each of one or more second pre-etched cavities that are associated with the one or more first pre-etched cavities such that each placed IC chip is disposed over the first pre-etched cavity including the die-attach material. A slight downward force is used while placing each IC chip over the first pre-etched cavities including the die-attach material so that each placed IC chip is substantially coplanar with the substrate. In addition, each IC chip is substantially accurately aligned by the walls of the second pre-etched cavity while placing the chip in the second pre-etched cavity. The placed IC chips are then secured to the substrate by curing the die-attach material. A dielectric layer is then formed over the substrate and the IC chips. Metallization structures are then formed over the dielectric material to electrically interconnect the IC chips.

In another aspect, the invention provides a multichip module. In one embodiment, the multichip module includes a substrate including one or more chip placement areas. Each chip placement area includes a pre-etched cavity. Each pre-etched cavity includes die-attach material. An IC chip overlies each chip placement area and over the die-attach material such that upper surfaces of the substrate and each IC chip are substantially coplanar. A miniature circuit board, including multiple layers of dielectric material and metallization structure, overlies the substrate and the IC chips to interconnect the IC chips.

In yet another aspect, the invention provides a multichip module. In one embodiment, the multichip module includes a substrate including one or more chip placement areas. Each chip placement area includes a pre-etched cavity and an associated alignment mark to aid in accurate alignment of a chip during placement of the chip over the chip placement area. Each cavity includes die-attach material. An IC chip overlies each of the one or more chip placement areas and the die-attach material such that the substrate and each IC chip are substantially coplanar. A miniature circuit board, including multiple alternating layers of dielectric material and metallization structures, overlies the substrate and the IC chips to interconnect the IC chips.

Additional advantages and features of the present invention will be more apparent from the detailed description and accompanying drawings, which illustrate preferred embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The term 'substrate' used in the following description may include materials, such as silicon, silicon-on insulator (SOI), silicon-on sapphire (SOS), doped and undoped semiconductors, epitaxial layers of silicon supported by a base semiconductor foundation, silica, ceramic, alumina, metals, organic materials, and other semiconductor structures. The semiconductor need not be silicon-based. The semiconductor could be silicon-germanium, germanium, or gallium arsenide. When reference is made to a wafer or substrate in the following description, previous process steps may be utilized to form regions, junctions, or layers in or on the base semiconductor or foundation.

The terms "semiconductive wafer fragment" or "wafer fragment" or "wafer" will be understood to mean any construction comprising semiconductor material, including but not limited to, bulk semiconductive materials, such as a semiconductor wafer (either alone or in assemblies comprising other material thereon) and a semiconductive material layer (either alone or in assemblies comprising other materials).

The terms "cavity", "well", and "pre-etched cavity" are used interchangeably throughout this specification. The term "active side" means the circuit side of a chip. The terms "chip", or "IC chip", or "semiconductor chip", or "semiconductor die" will be understood to mean an integrated circuit or other electronic component containing a semiconductor as a base material, and are used interchangeably throughout this specification.

The present invention provides techniques to fabricate a build-up single or multichip package. In some embodiments, the build-up multichip package may include a memory circuit including an array of memory cells disposed on a substrate and/or a logic circuit including an array of memory cells disposed on a substrate.

Figure 1:
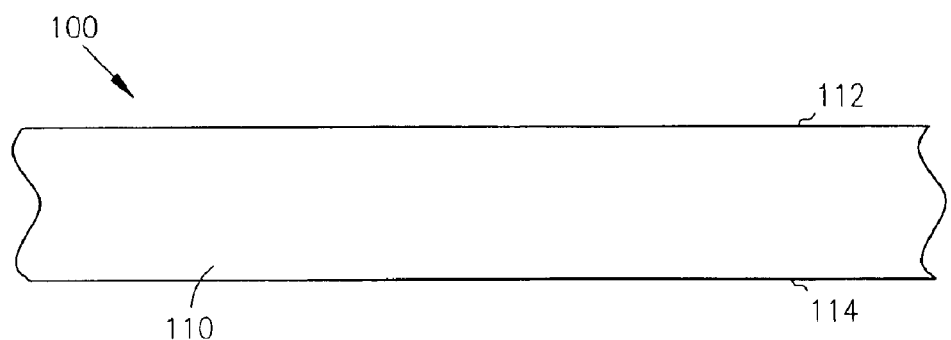
FIGS. 1, 2, 3, 4, 5, 7, 8, 9, 10, 11, and 12 are cross-sectional views of a semiconductor wafer fragment that illustrate sequential fabrication operations of a build-up multichip module according to an embodiment of the present invention.

FIGS. 1, 2, 3, 4, and 5 are cross-sectional views of a portion of semiconductor wafer fragment 100 illustrating one embodiment of sequential operations for forming one or more pre-etched cavities 140 on a substrate 110. The operation begins with a substrate 110 having top and bottom surfaces 112 and 114 as shown in FIG. 1. The substrate 110 can include semiconductor-based materials, such as silicon-on insulator (SOI), silicon-on sapphire (SOS), doped and undoped semiconductors, epitaxial layers of silicon supported by a base semiconductor foundation, silica, alumina, ceramic, and/or other semiconductor-based materials. The semiconductor-based materials can also include materials, such as silicon-germanium, germanium, and/or gallium arsenide.

Figure 2:
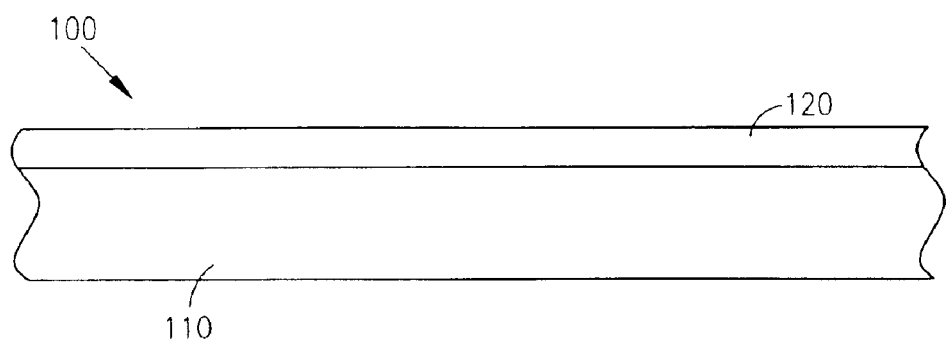
Figure 3:
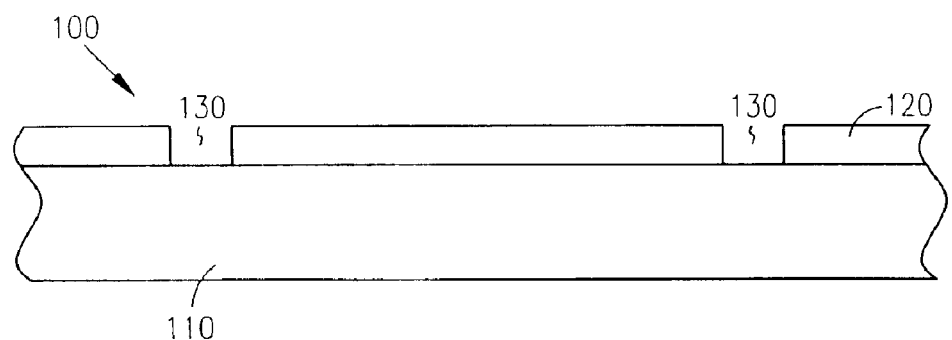
Figure 4:
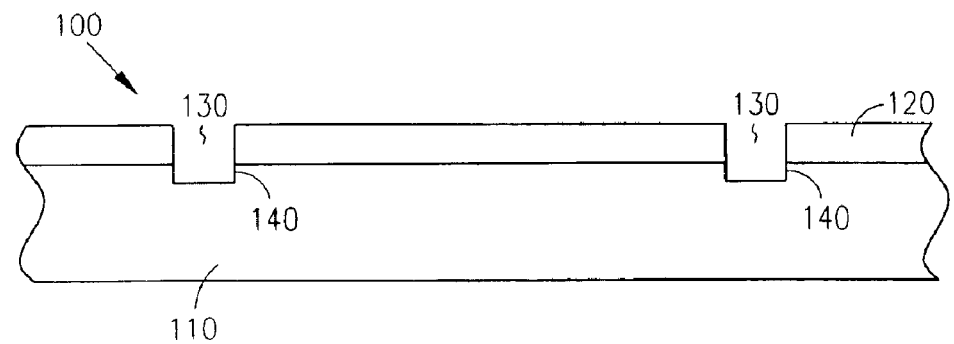

FIG. 2 illustrates deposition of a photoresist layer 120 to mask the top surface 112 of the substrate 110. A suitable photoresist layer comprises photoresist film JSR IX405 made by JSR Microelectronics. FIG. 3 illustrates exposing and developing photoresist layer 120 to form photoresist pattern 130. Photoresist pattern 130 can be developed based on desired shapes and locations for one or more pre-etched cavities 140 as shown in FIG. 4. One or more pre-etched cavities 140 can also be one or more wells.

FIG. 4 illustrates etching the photoresist layer 120 including photoresist pattern 130 using a solvent that is selective to photoresist layer 120 to form one or more pre-etched cavities 140. Solvents, such as KOH etchant, wet etchant, and/or dry etchant can be used to etch one or more pre-etched cavities 140. A suitable dry etch comprises exposing the photoresist layer 120 to $CF_4$ or $C_2F_6$, among others.

Figure 5:
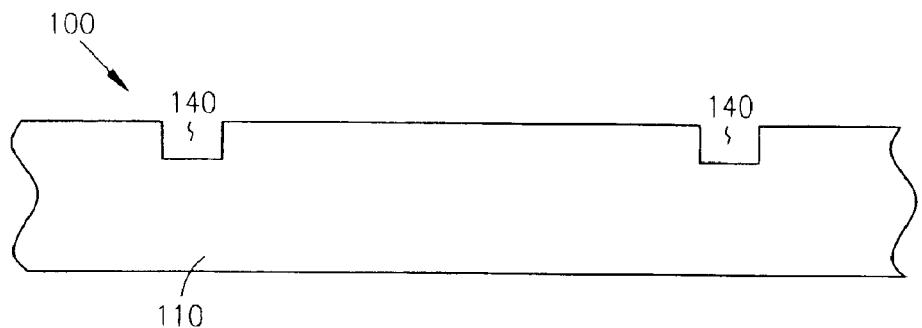

As depicted in FIG. 5, photoresist layer 120 is removed after etching the one or more pre-etched cavities 140, as shown in FIG. 4, to expose the formed one or more pre-etched cavities 140. A wet etchant, such as acetone or s photoresist stripper, such as Shipley's SVC-14 made by Strippers Corporation, among others can be used to remove the photoresist layer 120. Pre-etched cavities 140 can also be formed using other conventional processing techniques known to one skilled in the art.

Figure 6:
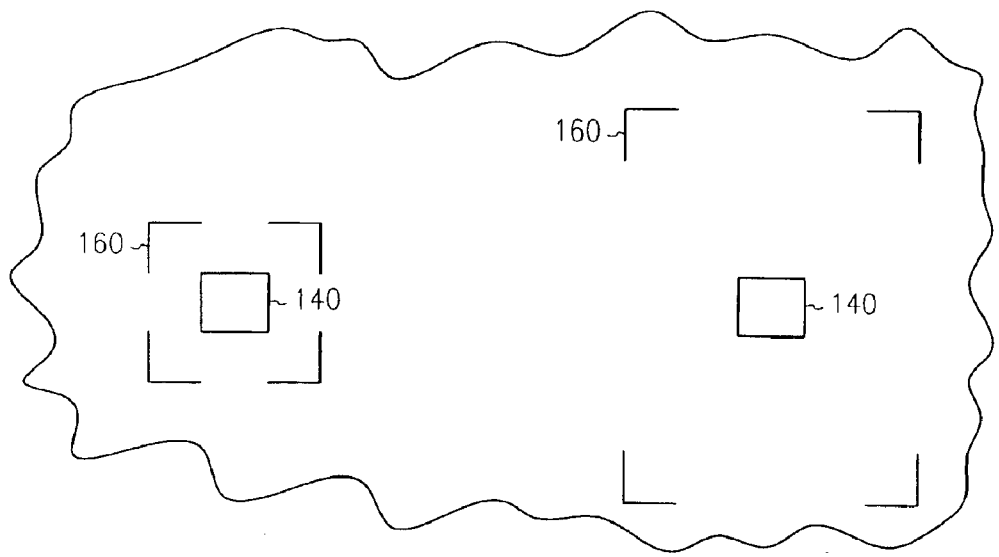
FIG. 6 is a top-down view of the semiconductor wafer fragment shown in FIG. 5.

FIG. 6 is a top view of semiconductor wafer fragment 100 shown in FIG. 5. FIG. 6 shows alignment marks 160 in addition to one or more pre-etched cavities 140 shown in FIG. 5. The alignment marks 160 are disposed around each of the one or more pre-etched cavities 140. Alignment marks 160 can also be formed using etching operations described above with reference to FIGS. 4 and 5. In these embodiments, alignment marks 160, such as those shown in FIG. 6, are used by pick-and-place machines to aid them in accurately aligning and placing the chips over the one or more pre-etched cavities 140. Alignment marks 160 help place the chips substantially accurately in both X and Y dimensions, as well as in holding the chip faces parallel in the same plane. Each of the alignment marks 160 is disposed at the outer boundaries of the chip placement area of an associated chip to be placed over a cavity 140 as shown in FIG. 6.

Figure 7:
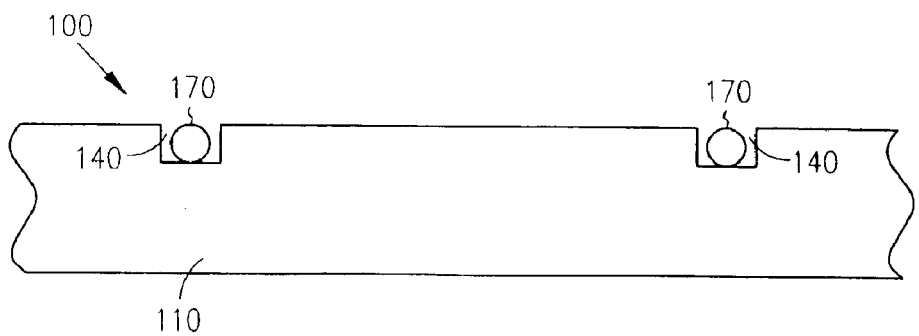

Referring to FIG. 7, die-attach material 170 is then dispensed in each of the one or more pre-etched cavities 140. The die-attach material 170 can include materials such as epoxy, polyimide, polyolefin, and BCB. A suitable die-attach material is a Dexter 536. The die-attach material 170 can be dispensed using processes, such as screen-printing, pneumatic dispensing, and positive dispensing. Dispensing equipment, such as a pick-and-place machine, a die-bonder, and/or die-attach equipment can be used to dispense the die-attach material. A suitable dispensing machine is a Datacom 2200apm dispensing machine.

Figure 8:
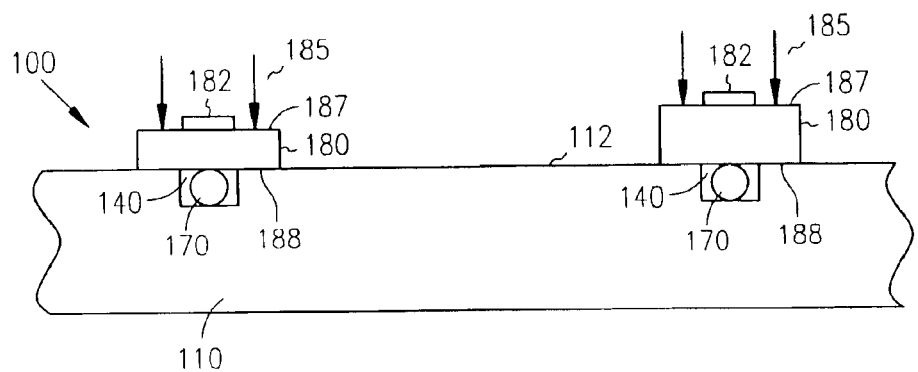

As shown in FIG. 8, a chip 180 is placed over each cavity 140, including die-attach material 170, with a slight downward force, as indicated by arrows 185, such that top surface 187 of each chip 180 is coplanar with the top surface 112 of substrate 110. In these embodiments, each chip 180 is placed over each cavity 140 such that the active surface is on top surface 187. The active surface 187 can include one or more contact pads 182. In some embodiments, each chip is accurately placed over each cavity using a high accuracy pick-and-place machine, such as the Datacom 2200apm. Exemplary chips 180 are semiconductor chips, semiconductor dies, semiconductor chips, and IC chips.

Figure 9:
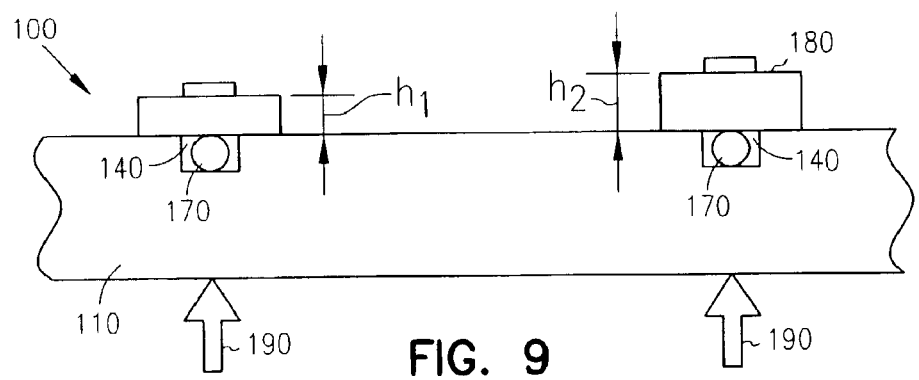

Referring to FIG. 9, each chip 180 is secured to the substrate 110 by curing the dispensed adhesive 170. The dispensed adhesive 170 holds each chip 180 in place after curing the adhesive 170. The adhesive 170 can be cured using a curing process, such as localized thermal curing, UV light curing (when a glass substrate is used), microwave curing, and/or infrared (IR) curing. In some embodiments, as indicated by directional arrows 190 in FIG. 9, localized thermal or UV light curing can be used to cure dispensed adhesive 170 in each cavity 140.

Figure 10:
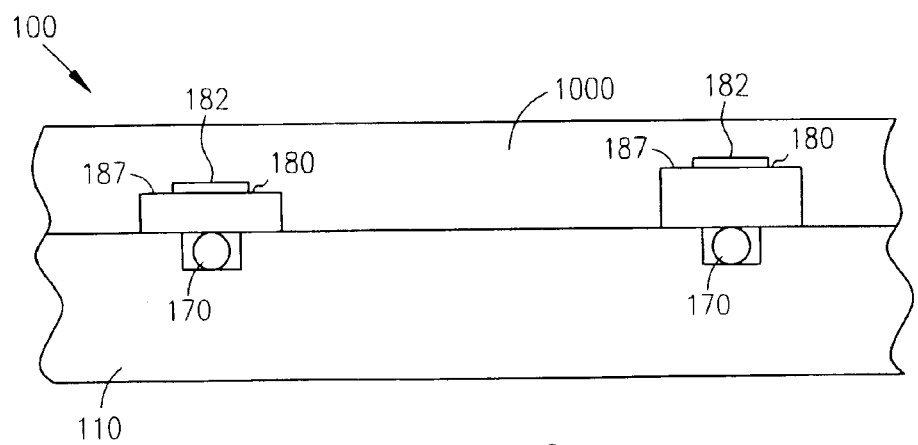

Referring to FIG. 10, after curing the dispensed adhesive 170, an encapsulating layer 1000 is deposited over the top surfaces of the substrate 112 and chips 187. In these embodiments, deposited encapsulating layer 1000 is substantially coplanar with the top surfaces of the substrate 112 and chips 187, because the top surface 187 of each placed chip 180 is substantially coplanar with the top surface 112 of the substrate 110, which results in consistent chip heights 'h$_1$' and 'h$_2$' as shown in FIG. 9. Therefore, only a thin encapsulating layer 1000 is needed over the top surfaces of substrate 112 and chips 187. Thinner encapsulating layer 1000 results in reduced thermal buildup and thermal stress during operation of the multichip module. In addition, variations in the thickness of the deposited encapsulating layer 1000 is considerably reduced due to the substantial coplanarity achieved between the top surfaces of substrate 112 and each of the chips 187. Reduced variation in the thickness of the encapsulating layer 1000 results in reduced variations in dielectric properties and post-processing problems, such as metal deposition rate, varying etch rate, and so on, which can ultimately result in a higher yield.

In some embodiments, encapsulating layer 1000 is a dielectric layer. In these embodiments, the dielectric layer can be formed using photo-patternable dielectric materials, such as polyimide, polyolefin, polynorbornene, Benzyl Cyclo Butane (BCB), and Poly Benzoxyzol (PBO). In these embodiments, dielectric layer 1000 is spray or spin coated over the top surfaces of the substrate 112 and each of the chips 187. The thickness of the dielectric layer can be in the range of 1 to 100 microns over the chip surface 187.

Figure 11:
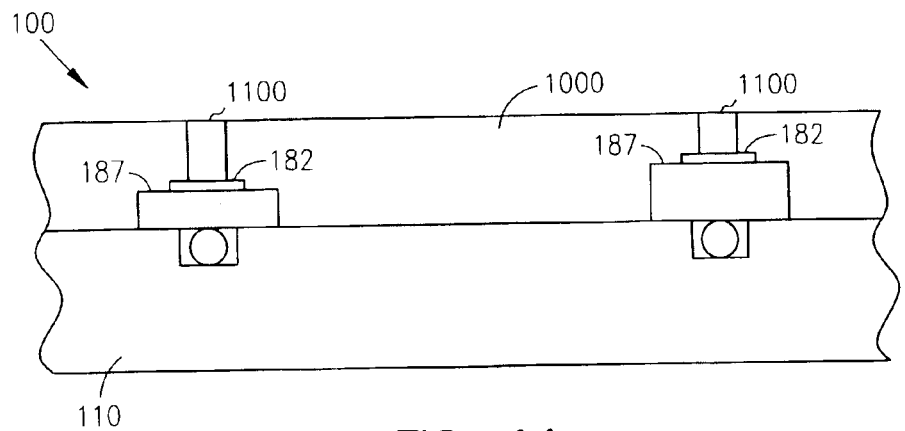

Referring to FIG. 11, via holes 1100 are formed in the dielectric layer 1000 to expose the at least one or more contact pads 182 at the upper surface 187 of each chip 180 for facilitating electrical connection on the dielectric layer 1000. In some embodiments, via holes are formed using an excimer laser.

Figure 12:
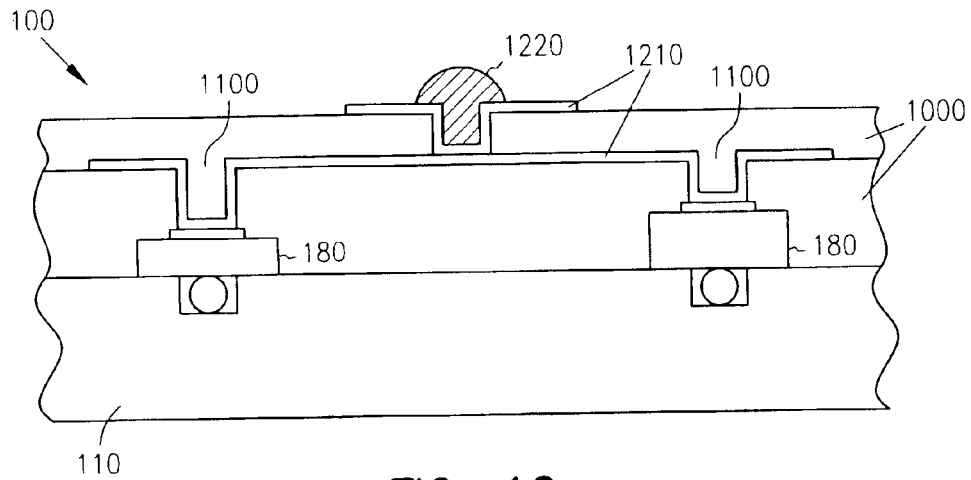

Referring to FIG. 12, metallization structures 1210 are formed over the dielectric layer 1000 and the via holes 1100 to interconnect the chips 180. In some embodiments, chip interconnection metallization structures 1210 are sputtered on the dielectric layer 1000 and via holes 1100. The metallization is subsequently built up electrolytically and patterned by photolithographic means. Additional interconnection layers are then built up as required by depositing dielectric layer 1000, forming via holes 1100, and metallizing structures 1210.

As shown in FIG. 12, input/output (I/O) structures 1220, such as solder bumps and/or gold-plated pad grids are formed over the metallization structures 1210. Gold-plated pad grid is achieved by pattern plating the copper to a thickness of approximately 1 micron or more, followed by plating nickel up to 5 microns and then gold up to 0.5 microns. Solder balls, and/or solder paste cones are placed at each site and reflowed to form the desired solder bumps. Note that solder bumps or connection pads can be placed directly above or offset to the side of the bare chips, thus allowing any desired I/O pad array configuration to be produced for the single packaged chip.

Figure 13:
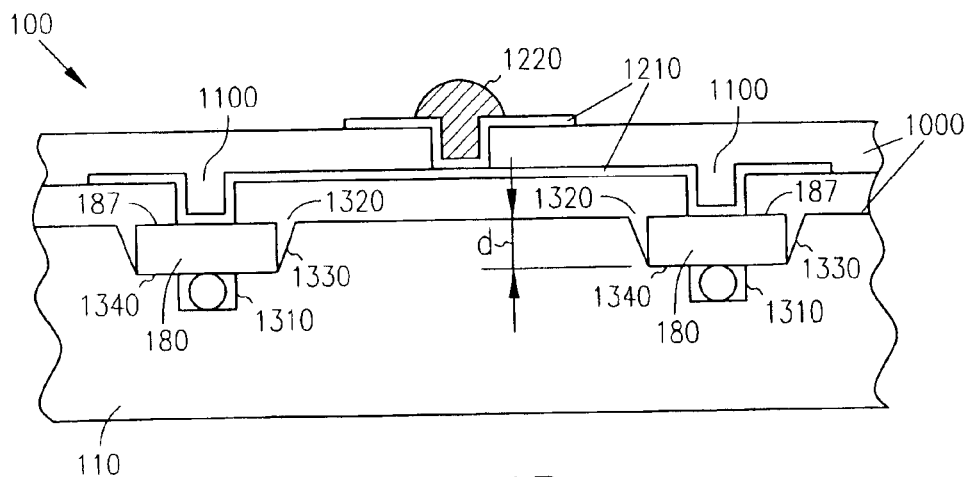
FIG. 13 is a cross-sectional view of a semiconductor wafer fragment that illustrates a multichip module fabricated according to another embodiment of the present invention.

FIG. 13 shows another embodiment in which chips 180 are placed inside a second cavity 1320. In this embodiment, die-attach material is dispensed in an earlier operation in a first cavity 1310. As shown in FIG. 13, first cavity 1310 is disposed below the second cavity 1320. In the embodiment shown in FIG. 13, first cavity 1310 is substantially concentric with the second cavity 1320. It can be envisioned that first cavity 1310 is offset from second cavity 1320. Second cavity 1320 is larger than first cavity 1310, as shown in FIG. 13. A recessed area 1340, similar to a chip placement area around the alignment marks 160 shown in FIGS. 5 and 6, is formed between the first and second cavities 1310 and 1320. The second cavity 1320 is large enough to receive an associated chip 180. In addition, second cavity 1320 has upwardly extending surfaces 1330 that extend from and around the recessed area 1340 as shown in FIG. 13. The upwardly extending surfaces 1330 help in substantially aligning chip 180 in X and Y dimensions during placement of each chip 180 in the second cavity 1320 and over the recessed area 1340.

The embodiment shown in FIG. 13 requires a substantially reduced thickness of the dielectric layer 1000 over the top surfaces of the substrate 112 and each chip 187 as compared to the embodiment shown in FIG. 12. Each chip 180 is placed inside the second cavity 1320 and the chip 180 protrusion beyond the top surface 112 of the substrate 110 can be reduced by controlling the depth 'd' of the second cavity 1320. As described above with reference to FIG. 10, a thinner dielectric layer reduces thermal stress and thermal build-up during operation of the single or multichip module. As shown in FIG. 13, dielectric layers 1000, via holes 1100, and metallizing structures 1210 are formed over the top surface 112 of the substrate 110 as described above with reference to FIGS. 10–12. Additional interconnection layers can then be built up as required by depositing dielectric layers 1000, forming via holes 1100, metallizing and patterning to form metallizing structures 1210.

Figure 14:
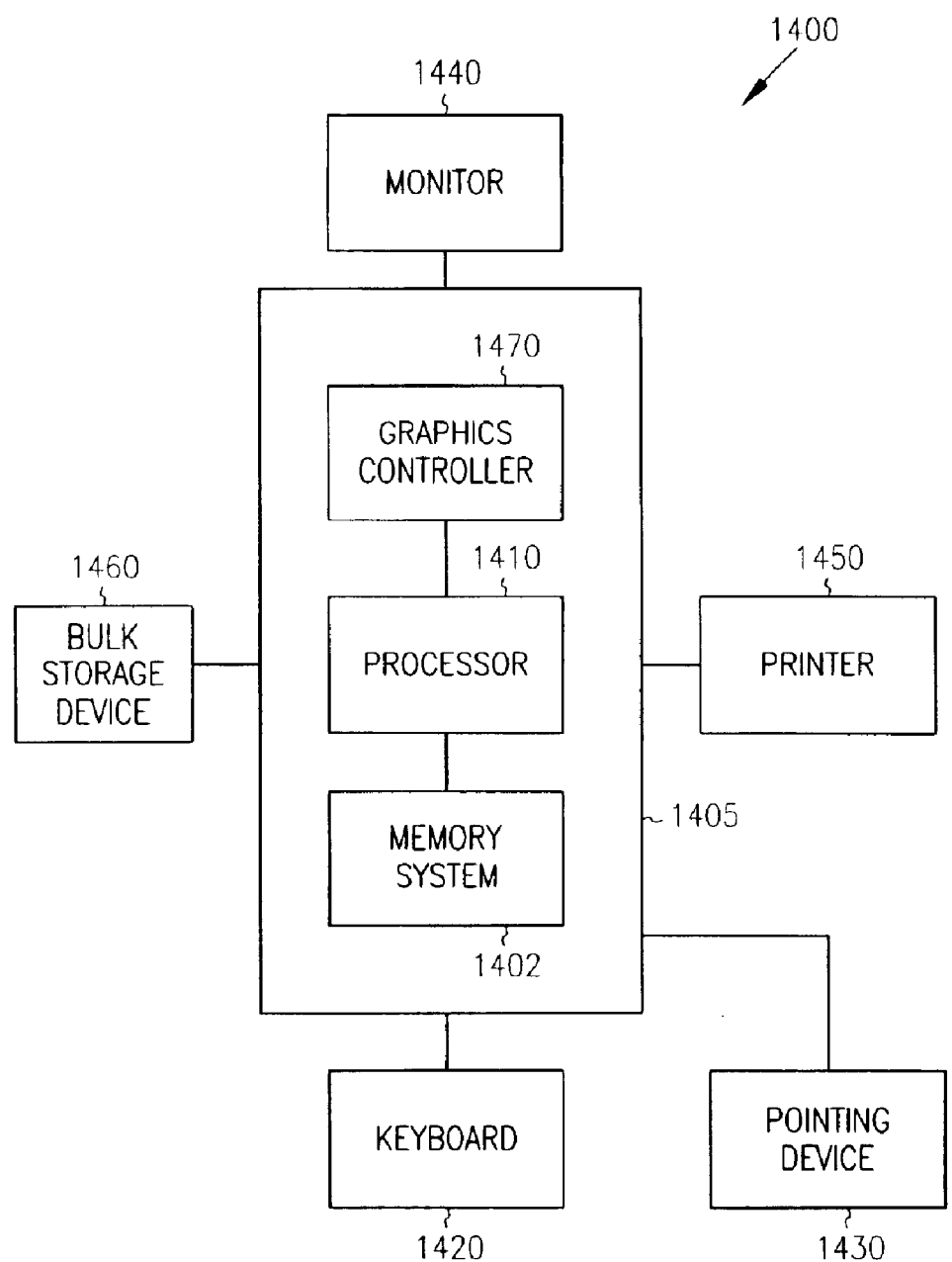
FIG. 14 is a block diagram of an exemplary computer system.

FIG. 14 is a block diagram of a system according to one embodiment of the present invention. Computer system 1400 contains a processor 1410 and a memory system 1402 housed in a computer unit 1405. Computer system 1400 is but one example of an electronic system containing another electronic system, e.g., memory system 1402, as a subcomponent. The memory system 1402 includes a memory device that includes a multichip module as discussed in various embodiments of the present invention. Computer system 1400 optionally contains user interface components. These user interface components include a keyboard 1420, a pointing device 1430, a monitor 1440, a printer 1450, and a bulk storage device 1460. It will be appreciated that other components are often associated with computer system 1400 such as modems, device driver cards, additional storage devices, etc. It will further be appreciated that the processor 1410 and memory system 1402 of computer system 1400 can be incorporated on a single integrated circuit. Such single-package processing units reduce the communication time between the processor and the memory circuit. Any of these components of the system may contain a multichip module that includes the build-up single or multichip module of the present invention. This is particularly true of graphics subsystem 1470 of FIG. 14 utilizing SGRAM that includes the multiple-mode output driver as discussed in various embodiments of the present invention.

Figure 15:
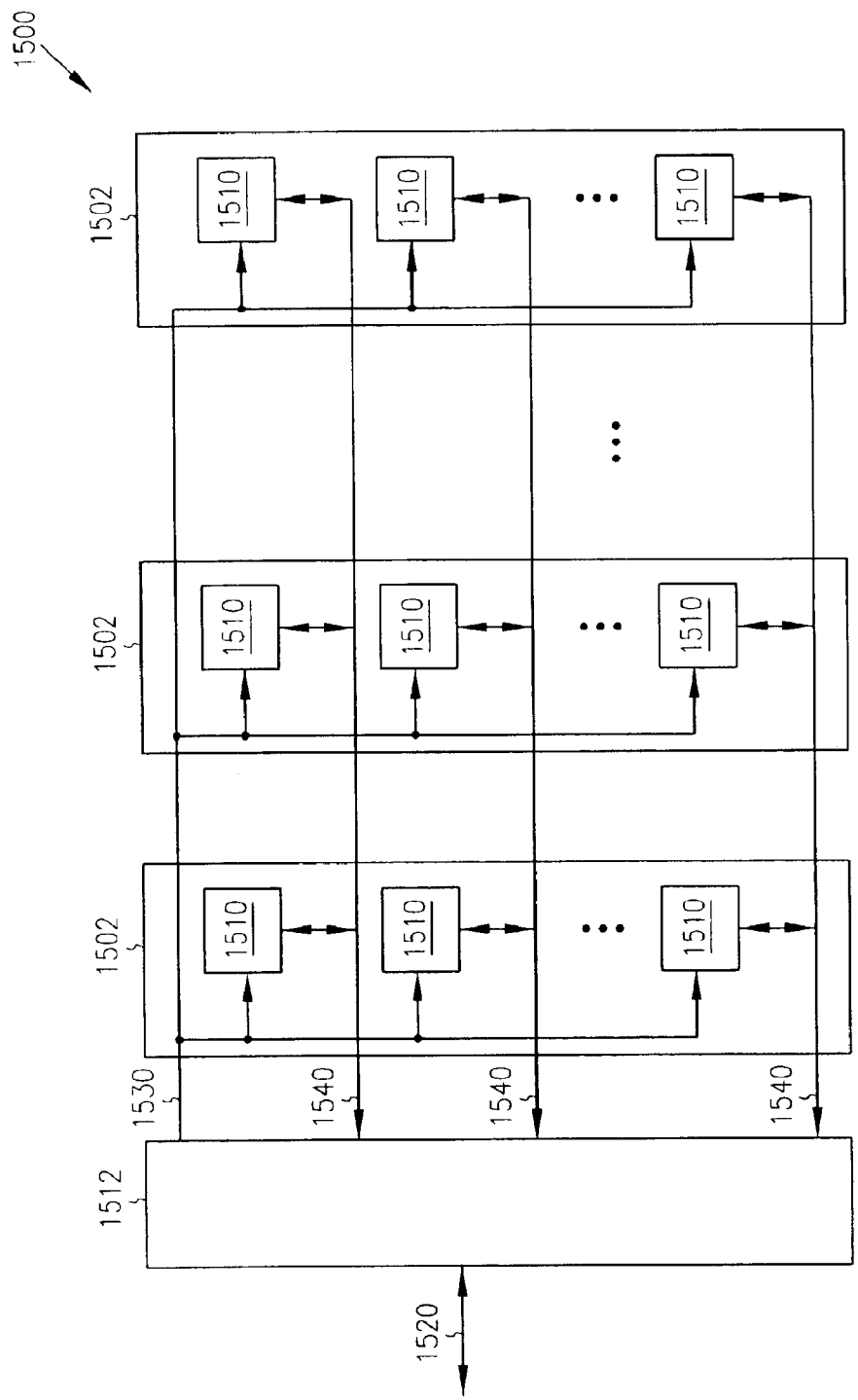
FIG. 15 is a block diagram of an exemplary memory system.
Figure 16:
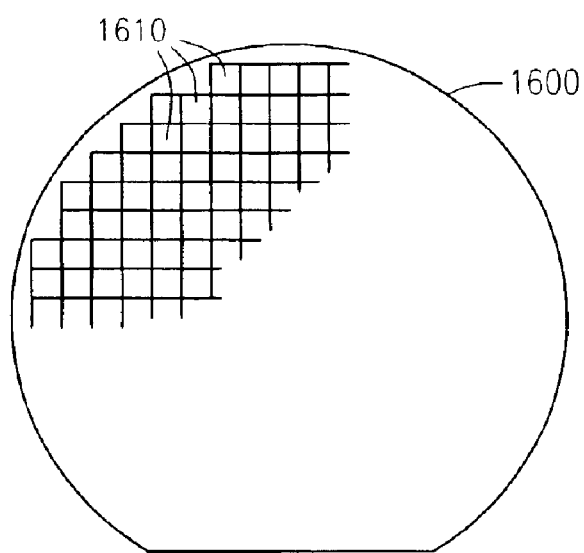
FIG. 16 is an elevational view of a substrate containing semiconductor dies.

FIG. 15 is a block diagram of a system according to one embodiment of the present invention. Memory system 1500 contains one or more multichip modules 1502 and a memory controller 1512. Each memory module 1502 includes at least one memory device 1510. Memory controller 1512 provides and controls a bidirectional interface between memory system 1500 and an external system bus 1520. Memory system 1500 accepts a command signal from the external bus 1520 and relays it to the one or more memory modules 1502 on a command link 1530. Memory system 1500 provides for data input and data output between the one or more memory modules 1502 and external system bus 1520 on data links 1540. At least one of the memory devices 1510 includes the single or multichip modules as discussed in various embodiments of the present invention. At least one of the memory devices 1510 includes the build-up multichip modules of the present invention. With reference to FIG. 16, in one embodiment, a semiconductor die 1610 is produced from a silicon wafer 1600. A die is an individual pattern, typically rectangular, on a substrate that contains circuitry to perform a specific function. A semiconductor wafer will typically contain a repeated pattern of such dies containing the same functionality. Die 1610 may contain multichip modules, as discussed above. Die 1610 may further contain additional circuitry to extend to such complex devices as a monolithic processor with multiple functionality. Die 1610 is typically packaged in single or multichip modules as discussed in various embodiments of the present invention.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A multichip module comprising:
    a substrate including one or more chip placement areas, wherein the substrate has an upper surface, wherein the one or more chip placement areas are disposed on the upper surface;
    first and second cavities disposed in each of the chip placement areas, wherein the second cavity is disposed above the first cavity and below the upper surface of the substrate, wherein the second cavity is larger than the first cavity;
    die-attach material disposed in each first cavity; and
    an IC chip is disposed over each chip placement are, inside the second cavity and over the die-attach material, wherein the IC chip has an upper surface and lower surface, wherein the upper surface of the IC chip is disposed across from the lower surface of the IC chip, wherein the lower surface of each IC chip is disposed over an associated chip placement area such that the upper surface of each IC chip is coplanar with the upper surface of the substrate.

2. The multichip module of claim 1, wherein each of the chip placement areas further comprise:
    an alignment mark associated with each cavity, wherein the alignment mark aids in aligning the IC chip while placing the IC chip over the associated chip placement area.

3. The multichip module of claim 2, further comprising:
    a dielectric layer disposed over the upper surface of the substrate and the upper surface of each IC chip, wherein the dielectric layer is coplanar with the upper surface of the substrate and the upper surface of each IC chip.

4. The multichip module of claim 3, further comprising:
    at least one contact pad on the upper surface of each IC chip; and one or more metallization structures above the dielectric layer to electrically interconnect each of the at least one contact pads.

5. The multichip module of claim 3, further comprising:
    at least one contact pad on the upper surface of each IC chip; and
    alternating layers of metallization structures and dielectric layers over the dielectric layer disposed on the upper surface of the substrate and the upper surface of each IC chip to interconnect the at least one contact pads.

6. The structure of claim 1, wherein the die-attach material is curable by one selected from the group consisting of localized thermal curing, UV light curing, and microwave curing.

7. The structure of claim 1, wherein the one or more semiconductor chips include a memory device.

8. The structure of claim 7, wherein the one or more semiconductor chips include a memory controller operably connected to the memory device.

9. The structure of claim 7, wherein the one or more semiconductor chips include a processor operably connected to the memory device.

10. A semiconductor structure on a substrate having an upper surface, comprising:
    one or more pre-etched cavities disposed over the upper surface of the substrate;
    one or more alignment marks associated with each pre-etched cavity disposed over the upper surface of the substrate;
    die-attach material disposed in each pre-etched cavity, wherein the volume of die-attach material disposed in each pre-etched cavity is in the range of about one-half to two-thirds the volume of the pre-etched cavity;
    one or more semiconductor chips, where each semiconductor chip has an upper surface and a lower surface, wherein each semiconductor chip is disposed over each pre-etched cavity and die-attach material, wherein the lower surface of each semiconductor chip is in contact with the upper surface of the substrate, wherein the upper surface of the substrate is coplanar with the upper surface of each semiconductor chip; and
    a dielectric layer overlying the upper surface of the substrate and the upper surface of each semiconductor chip, wherein the dielectric layer is coplanar with the upper surface of each semiconductor chip.

11. The structure of claim 10, further comprising:
at least one contact pad overlying the upper surface of each semiconductor chip; and
one or more metallization structures overlying the dielectric layer and interconnecting the at least one contact pad of each semiconductor chip.

12. The structure of claim 11, further comprising:
metallized via holes disposed in the dielectric layer to expose the at least one contact pad of each semiconductor chip to facilitate electrical interconnection between the at least one contact pad of the one or more semiconductor chips.

13. The structure of claim 10, wherein the dielectric layer comprises a material selected from the group consisting of polyimide, polyolefin, polynorbornene, BCB, and PBO.

14. The structure of claim 10 wherein the substrate comprises materials selected from the group consisting of ceramic, silicon dioxide, and gallium arsenide.

15. The semiconductor structure of claim 10, wherein the substrate has a further surface that is coplanar with the upper surface of each semiconductor chip.

16. The structure of claim 15, further comprising:
metallized via holes disposed in the dielectric layer to expose the contact pad of each semiconductor chip to facilitate electrical interconnection between the contact pad of the one or more semiconductor chips.

17. The structure of claim 15, wherein the dielectric layer comprises a material selected from the group consisting of polyimide, polyolefin, polynorbornene, BCB and PBO.

18. The structure of claim 17, wherein the substrate comprises materials selected from the group consisting of ceramic, silicon dioxide, and gallium arsenide.

19. The structure of claim 10, wherein the die-attach material is curable by one selected from the group consisting of localized thermal curing, UV light curing, and microwave curing.

20. The structure of claim 10, wherein the one or more semiconductor chips include a memory device.

21. The structure of claim 20, wherein the one or more semiconductor chips include a memory controller operably connected to the memory device.

22. The structure of claim 21, wherein the die-attach material is curable by one selected from the group consisting of localized thermal curing, UV light curing, and microwave curing.

23. The structure of claim 20, wherein the one or more semiconductor chips include a processor operably connected to the memory device.

24. A multichip module on a substrate including an upper surface, wherein the upper surface has one or more chip placement areas, comprising:
first and second cavities disposed in each of the chip placement areas, wherein the first cavity is concentric with the second cavity, wherein the second cavity is disposed above the first cavity and below the upper surface of the substrate, wherein the second cavity is larger than the first cavity such that a recessed area is formed between the first and second cavities;
die-attach material disposed in each first cavity;
one or more semiconductor chips, wherein each semiconductor chip has an upper surface and a lower surface, wherein the upper surface of the semiconductor chip is disposed across from the lower surface of the semiconductor chip, wherein each semiconductor chip, wherein each semiconductor chip is disposed inside the second cavity and over the first cavity and over the first cavity and the die-attach material, wherein the lower surface of each semiconductor chip is in contact with the recessed area of the substrate, wherein the upper surface of the substrate is coplanar with the upper surface of the substrate is coplanar with the upper surfac of each semiconductor chip; and
a dielectric layer overlying the upper surface of the substrate and the upper surface of each semiconductor chip such that the dielectric layer is coplanar with the upper surface of the substrate and each of the one or more semiconductor chips.

25. The mulitchip module of claim 24, wherein the second cavity has upwardly extending surfaces from the recessed area that terminate at the upper surface of the substrate, wherein the upwardly extending surfaces substantially surround the semiconductor chip to align the semiconductor chip when placing the semiconductor chip.

26. The multichip module of claim 24, further comprising: at least one contact pad overlying the upper surface of each semiconductor chip; and
a multilayer structure, wherein the multilayer structure includes one or more alternating layers of metallization structure overlying the dielectric layer, wherein the multilayer structure interconnects the at least one contact pad of each semiconductor chip.

27. The structure of claim 24, wherein the die-attach material is curable by one selected from the group consisting of localized thermal curing, UV light curing, and microwave curing.

28. The structure of claim 24, wherein the one or more semiconductor chips include a memory device.

29. The structure of claim 28, wherein the one or more semiconductor chips include a memory controller operably connected to the memory device.

30. The structure of claim 28, wherein the one or more semiconductor chips include a processor operably connected to the memory device.

31. A semiconductor circuit comprising:
a substrate including one or more chip placement areas, wherein the substrate has an upper surface, wherein each of the one or more chip placement areas is disposed on the upper surface;
first and second cavities disposed in each of the chip placement areas, wherein the second cavity is disposed above the first cavity and below the upper surface of the substrate, wherein the second cavity is larger than the first cavity;
die-attach material disposed in each first cavity; and
an IC chip disposed over each chip placement area, inside the second cavity over the die-attach material, wherein the IC chip has an upper surface and lower surface, wherein the upper surface is disposed across from the lower surface, wherein the upper surface has an active surface, wherein the lower surface of the IC chip is disposed over the chip placement area such that the upper surface of the IC chip is coplanar with the upper surface of the substrate.

32. The circuit of claim 31, wherein each of the chip placement areas further comprise:
an alignment mark associated with each cavity, wherein each alignment mark aids in aligning the IC chip while placing the IC chip over the chip placement area.

33. The circuit of claim 31, further comprising:
a dielectric layer overlying the upper surface of the substrate and the upper surface of each IC chip, wherein the upper surface of the dielectric layer is coplanar with the upper surfaces of the substrate and each IC chip.

34. The circuit of claim 33, further comprising: at least one contact pad disposed on the active surface of each IC chip; and one or more metallization structures above the dielectric layer to electrically interconnect each of the least one contact pad.

35. The circuit of claim 33, further comprising:
a multilayer structure including alternating layers of metallization structures and dielectric layer over the upper surface of the substrate and the upper surface of each IC chip.

36. The circuit of claim 31, wherein the die-attach material is cured to secure the IC chip over the upper surface of the substrate.

37. The structure of claim 31, wherein the die-attach material is curable by one selected from the group consisting of localized thermal curing, UV light curing, and microwave curing.

38. The structure of claim 31, wherein the one or more semiconductor chips include a memory device.

39. The structure of claim 38, wherein the one or more semiconductor chips include a memory controller operably connected to the memory device.

40. The structure of claim 38, wherein the one or more semiconductor chips include a processor operably connected to the memory device.

41. An electronic packaging assembly comprising:
a substrate including one or more chip placement areas, wherein the substrate has upper and lower surfaces, wherein each of the one or more chip placement areas is disposed on the upper surfaces;
first and second cavities disposed in each of the chip placement areas, wherein the second cavity is disposed above the first cavity and below the upper surface of the substrate, wherein the second cavity is larger than the first cavity;
die-attach material disposed in each first cavity;
an IC chip disposed over each chip placement area, inside the second cavity and over the die-attach material, wherein the IC chip has an upper surface and lower surface, wherein the upper surface is disposed across from the lower surface, wherein the upper surface has an active surface, wherein the lower surface of the IC chip is disposed over the chip placement area such that the upper surface of the IC chip is coplanar with the upper surface of the IC chip is coplanar with the upper surface of the substrate, wherein at least one contact pad is disposed over the active surface of each chip;
a dielectric layer overlying the upper surface of the substrate and the upper surface of each IC chip, wherein the upper surface of the dielectric layer is coplanar with the upper surfaces of the substrate and each IC chip;
one or more metallization structures above the dielectric above the dielectric layer to electrically interconnect each of the at least one contact pads;
input/output structure are attached to the one or more metallization structures; and
a circuit board assembly including electrical components, wherein the circuit board assembly is attached to input/output structures.

42. The structure of claim 41, wherein the die-attach material is curable by one selected from the group consisting of localized thermal curing, UV light curing, and microwave curing.

43. The structure of claim 41, wherein the one or more semiconductor chips include a memory device.

44. The structure of claim 43, wherein the one or more semiconductor chips include a memory controller operably connected to the memory device.

45. The structure of claim 43, wherein the one or more semiconductor chips include a processor operably connected to the memory device.

46. A structure, comprising:
an electronic device; and
a multichip module operably connected to the electronic device, the module comprising:
a substrate including one or more chip placement areas, wherein the substrate has an upper, surface, wherein the one or more chip placement areas are disposed on the upper surface;
first and second cavities disposed in each of the chip placement areas, wherein the second cavity is disposed above the first cavity and below the upper surface of the substrate, wherein the second cavity is larger than the first cavity;
die-attach material disposed in each first cavity; and
an IC chip disposed over each chip placement area, inside the second cavity and over the die-attach material, wherein the IC chip has an upper surface and lower surface, wherein the upper surface of the IC chip is disposed across from the lower surface of the IC chip, wherein the lower surface of each IC chip is disposed over an associated chip placement area such that the upper surface of each IC chip is coplanar with the upper surface of the substrate.

47. The structure of claim 46, wherein the electronic device includes a memory system.

48. The structure of claim 46, wherein the electronic device includes a processor.

49. The structure of claim 46, wherein each of the chip placement areas further comprise an alignment mark associated with each cavity, wherein the alignment mark aids in aligning the IC chip while placing the IC chip over the associated chip placement area.

50. The structure of claim 49, wherein the multichip module further comprises a dielectric layer disposed over the upper surface of the substrate and the upper surface of each IC chip, wherein the dielectric layer is coplanar with the upper surface of the substrate and the upper surface of each IC chip.

51. The structure of claim 50, wherein the multichip module further comprises:
at least one contact pad on the upper surface of each IC chip; and
one or more metallization structures above the dielectric layer to electrically interconnect each of the at least one contact pads.

52. The structure of claim 50, wherein the multichip module further comprises:
at least one contact pad on the upper surface of each IC chip; and
alternating layers of metallization structures and dielectric layers over the dielectric layer disposed on the upper surface of the substrate and the upper surface of each IC chip to interconnect the at least one contact pads.

* * * * *

UNITED STATES PATENT AND TRADEMARK OFFICE
CERTIFICATE OF CORRECTION

PATENT NO. : 7,135,780 B2
APPLICATION NO. : 10/365998
DATED : November 14, 2006
INVENTOR(S) : Jiang It is certified that error appears in the above-identified patent and that said Letters Patent is hereby corrected as shown below:

In column 5, line 10, delete "coplanar" and insert -- parallel --, therefor.

In column 8, line 1, in Claim 1, after "IC chip" delete "is".

In column 8, line 1, in Claim 1, delete "are," and insert -- area, --, therefor.

In column 8, lines 63–65, in Claim 10, after "substrate" delete ", wherein the upper surface of the substrate is coplanar with the upper surface of each semiconductor chip".

In column 9, line 32, in Claim 17, after "BCB" insert -- , --.

In columns 9 and 10, lines 67 and 1, in Claim 24, after "semiconductor chip" delete ", wherein each semiconductor chip".

In column 10, lines 2–3, in Claim 24, after "first cavity and" delete "over the first cavity and".

In column 10, line 7, in Claim 24, after "of" delete "the substrate is coplanar with the upper surfac of".

In column 10, line 13, in Claim 25, delete "mulitchip" and insert -- multichip --, therefor.

In column 10, line 52, in Claim 31, after "cavity" insert -- and--.

In column 11, line 7, in Claim 34, after "the" insert -- at --.

In column 11, line 32, in Claim 41, delete "surfaces;" and insert -- surface; --, therefor.

In column 11, lines 47–48, in Claim 41, after "of the" delete "IC chip is coplanar with the upper surface of the".

In column 11, line 57, in Claim 41, before "layer" delete "above the dielectric".

In column 11, line 59, in Claim 41, delete "structure" and insert -- structures --, therefor.

UNITED STATES PATENT AND TRADEMARK OFFICE
CERTIFICATE OF CORRECTION

PATENT NO. : 7,135,780 B2
APPLICATION NO. : 10/365998
DATED : November 14, 2006
INVENTOR(S) : Jiang It is certified that error appears in the above-identified patent and that said Letters Patent is hereby corrected as shown below:

In column 12, line 15, in Claim 46, delete "upper, surface," and insert -- upper surface, --, therefor.

Signed and Sealed this

Twenty-seventh Day of February, 2007

JON W. DUDAS
*Director of the United States Patent and Trademark Office*